United States Patent
Shibata

(10) Patent No.: US 6,770,980 B2
(45) Date of Patent: Aug. 3, 2004

(54) SEMICONDUCTOR DEVICE HAVING SEMICONDUCTOR ELEMENT PACKAGED ON INTERPOSER

(75) Inventor: Jun Shibata, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 40 days.

(21) Appl. No.: 10/222,841

(22) Filed: Aug. 19, 2002

(65) Prior Publication Data

US 2003/0052399 A1 Mar. 20, 2003

(30) Foreign Application Priority Data

Sep. 20, 2001 (JP) ........................................ 2001-286635

(51) Int. Cl.$^7$ ............................................. H01L 23/48
(52) U.S. Cl. ..................... 257/777; 257/723; 361/777
(58) Field of Search ................... 174/260, 261; 438/129, 130; 361/777, 760, 783; 257/723, 780, 738, 777, 778

(56) References Cited

U.S. PATENT DOCUMENTS

| | | | | |
|---|---|---|---|---|
| 5,953,216 A | * | 9/1999 | Farnworth et al. | 361/777 |
| 6,359,341 B1 | * | 3/2002 | Huang et al. | 257/778 |
| 6,365,978 B1 | * | 4/2002 | Ibnabdeljalil et al. | 257/786 |
| 6,373,131 B1 | * | 4/2002 | Karnezos | 257/712 |
| 6,376,908 B1 | * | 4/2002 | Gaku et al. | 257/707 |
| 6,392,301 B1 | * | 5/2002 | Waizman et al. | 257/774 |
| 6,400,010 B1 | * | 6/2002 | Murata | 257/706 |
| 6,469,897 B2 | * | 10/2002 | Ho et al. | 361/704 |
| 6,486,551 B1 | * | 11/2002 | Sato et al. | 257/737 |
| 6,492,714 B1 | * | 12/2002 | Kasatani | 257/678 |

FOREIGN PATENT DOCUMENTS

| | | |
|---|---|---|
| JP | 2-224266 | 9/1990 |
| JP | 11-135711 | 5/1999 |

* cited by examiner

*Primary Examiner*—Kamand Cuneo
*Assistant Examiner*—Lourdes (Elle) Cruz
(74) *Attorney, Agent, or Firm*—McDermott Will & Emery LLP

(57) ABSTRACT

First electrodes disposed on the surface of the substrate comprise a plurality of chip select electrodes, and the first chip select electrode among a plurality of chip select electrodes to in electrically connected only to a semiconductor element. The N-th (N is a integer of 2 or more) chip select electrode is electrically connected only to the second electrode disposed on the back at position corresponding to the (N−1)-th chip select electrode, and the plurality of chip select electrodes are sporadically disposed in the first electrodes.

7 Claims, 4 Drawing Sheets

SEMICONDUCTOR DEVICE HAVING SEMICONDUCTOR ELEMENT PACKAGED ON INTERPOSER

BACKGROUND OF THE INVENTION

1. Field of the Invention

The present invention relates to a semiconductor device, and more specifically to a semiconductor device comprising semiconductor elements packaged on an interposer.

2. Description of the Background Art

Heretofore, in order to reduce the packaging area of semiconductor devices on a circuit substrate, there have been disclosed techniques for laminating a plurality of semiconductor devices comprising semiconductor elements (chips), such as memories, disposed on the substrate called an interposer and for packaging the laminated semiconductor devices on a circuit substrate (e.g., Japanese Patent Laid-Open No. 11-135711).

A conventional semiconductor device will be briefly described below referring to FIGS. 6 to 8. FIG. 6 is a schematic sectional view of a conventional semiconductor device, and FIG. 7 is a schematic plan thereof. Specifically, FIG. 6 shows the cross-section along the line X-X in FIG. 7. Furthermore, FIG. 8 is a schematic sectional view of a conventional semiconductor device module manufactured by laminating semiconductor devices of FIG. 6.

In FIGS. 6 to 8, the reference numeral 1 denotes a chip (semiconductor element) cut from a wafer; 2, and 2A to 2C denote an interposer (substrate) made of materials such as glass-epoxy base and copper foil; 2a denotes the back of the interposer 2; 2b denotes the top surface of the interposer 2; 3 denotes common electrodes for transmitting common signals to the chip 1; 3a denotes a first chip select electrode (chip select electrode No. 1); 3b denotes a second chip select electrode (chip select electrode No. 2); 3c denotes a third chip select electrode (chip select electrode No. 3). The reference numeral 4 denotes second electrodes for the common electrodes disposed on the location of the back 2a corresponding to the common electrodes 3; 4a denotes a second electrode for the first chip select electrode disposed on the location of the back 2a corresponding to the first chip select electrode 3a; 4b denotes a second electrode for the second chip select electrode disposed on the location of the back 2a corresponding to the second chip select electrode 3b; 4c denotes a second electrode for the third chip select electrode disposed on the location of the back 2a corresponding to the third chip select electrode 3c; 5 denotes thin metal wires for electrically connecting the chip 1 to the first electrode group; 6 denotes a first wiring for chip selecting; 7 denotes wirings for the common electrode; 7a denotes a second wiring for chip selecting; 7b denotes a third wiring for chip selecting; and 8 denotes an encapsulating resin for protecting the chip 1 and metal wires 5, and fixing the chip 1 to the interposer 2.

As FIGS. 6 and 7 show, a chip 1 is disposed on substantially the central portion of the surface 2b of an interposer 2. A first electrode group is linearly disposed on the both sides of the chip 1 so as to sandwich the chip 1. The first electrode group comprises a plurality of common electrodes 3 and a plurality of chip select electrodes 3a to 3c, and these are solder-ball terminals disposed so as to protrude from the surface 2b of an interposer 2. The a plurality of chip select electrodes 3a to 3c are disposed on the end region of the first electrode group so as to be adjacent to each other.

Also, as FIG. 6 shows, a second electrode group is disposed on the back 2a of the interposer 2 on the location corresponding to the first electrode group on the surface 2b. The second electrode group comprises a plurality of second electrodes 4 for common electrodes and a plurality of second electrodes 4a to 4c for chip select electrodes, and these are land patterns formed by, for example, photoengraving. The second electrodes 4 for common electrodes on the back 2a are disposed on the locations plane-symmetrical to the common electrodes 3 on the surface 2b, and the second electrodes 4a to 4c for chip select electrodes on the back 2a are disposed on the locations plane-symmetrical to the chip select electrodes 3a to 3c on the surface 2b.

Also, as FIG. 6 shows, the first chip select electrode 3a is electrically connected to the predetermined electrode pad on the chip 1 through a thin metal wire 5 and a first wiring for chip selecting 6. The second chip select electrode 3b is electrically connected to the second electrode 4a for the first chip select electrode disposed on the back 2a side of the first chip select electrode 3a through a second wiring for chip selecting 7a. Furthermore, the third chip select electrode 3c is electrically connected to the second electrode 4b for the second chip select electrode disposed on the back 2a side of the second chip select electrode 3b through a third wiring for chip selecting 7b.

On the other hand, the common electrodes 3 are connected to the chip 1 through the thin metal wires and wirings, and also connected to the second electrodes 4 for common electrodes on the back 2a through the wirings 7 for common electrodes.

The wirings 7 for common electrodes, the second wiring for chip selecting 7a, and the third wiring for chip selecting 7b are adopted to connect the first electrodes on the surface 2b with the second electrodes on the back 2a through through-holes formed in the interposer 2.

The semiconductor devices thus constituted are laminated, as shown in FIG. 8, to form a semiconductor device module. Specifically, the first electrode group formed on the surface 2b of the interposer 2B in the second-level semiconductor device is stacked on the second electrode group formed on the back 2a of the interposer 2A in the first-level semiconductor device. Furthermore, the first electrode group formed on the surface 2b of the interposer 2C in the third-level semiconductor device is stacked on the second electrode group formed on the back 2a of the interposer 2B in the second-level semiconductor device.

The semiconductor device module thus formed is packaged on a circuit substrate (not shown) such as a motherboard. Specifically, the first electrode group in the first-level semiconductor device is stacked on the predetermined electrodes formed on the circuit substrate.

Then, common signals, such as ground signals, address signals, and data signals, are transmitted from the circuit substrate to chips 1A, 1B, and 1C of the first, second and third levels, respectively.

On the other hand, the chip select signals transmitted from the circuit substrate for selecting predetermined chips 1A to 1C are transmitted to predetermined chips 1A to 1C through predetermined chip select electrodes 3a to 3c.

Specifically, the first chip select signal for selecting the chip 1A of the first-level semiconductor device transmitted from the circuit substrate is transmitted to the chip 1A of the first-level semiconductor device through the first chip select electrode 3a, the first wiring 6 for chip selecting, and a thin metal wire 5 in the first-level interposer 2A.

The second chip select signal for selecting the chip 1B of the second level transmitted from the circuit substrate is transmitted to the chip 1B of the second level through the second chip select electrode 3*b*, the second wiring for chip selecting 7*a*, and the second electrode 4*a* for the first chip select electrode in the first-level interposer 2A; and further through the first chip select electrode 3*a*, the first wiring 6, and a thin metal wire 5 in the second-level interposer 2B.

The third chip select signal for selecting the chip 1C of the third level transmitted from the circuit substrate is transmitted to the chip 1C of the third level through the third chip select electrode 3*c*, the third wiring for chip selecting 7*b*, and the second electrode 4*b* for the second chip select electrode in the first-level interposer 2A; through the second chip select electrode 3*b*, the second wiring for chip selecting 7*a*, and the second electrode 4*a* for the first chip select electrode in the second-level interposer 2B; and further through the first chip select electrode 3*a*, the first wiring 6, and a thin metal wire 5 in the third-level interposer 2C.

In a conventional semiconductor device, as described above, the packaging area of the semiconductor device on a circuit substrate is reduced by packaging a semiconductor device module of a laminated structure on the circuit substrate. Since an interposer is used in common to laminated semiconductor devices, the productivity of the semiconductor device module is raised, and the manufacturing costs are reduced.

In the above-described semiconductor device, however, since a plurality of chip select electrodes are arranged in columns always on limited locations in the first electrode group, i.e., on the locations adjacent to each other, there has been a problem that the locations of the electrodes on the circuit substrate corresponding to these electrodes are also limited. In other words, on the circuit design of a circuit substrate, there has been a layout problem that the electrodes that contact the chip select electrodes must be disposed in column so as to be adjacent to each other.

SUMMARY OF THE INVENTION

The present invention has been conceived to solve the previously-mentioned problems. An object of the present invention is to provide a semiconductor device having a reduced semiconductor-device packaging area on a circuit substrate, using a common substrate of the laminated semiconductor devices, and having a high freedom of circuit design.

The above object of the present invention is attained by a following semiconductor device.

According to an aspect of the present invention, the semiconductor device comprises a semiconductor element disposed on the surface of a substrate. A first electrodes disposed on the surface of the substrate. A second electrodes disposed on the back of the substrate at positions corresponding to the first electrodes. The first electrodes have a plurality of chip select electrodes. The first chip select electrode of the plurality of chip select electrodes is electrically connected only to the semiconductor element. The N-th (N is a integer of 2 or more) chip select electrode of the plurality of chip select electrodes is electrically connected only to the second electrode disposed on the back on the location corresponding to the (N−1)-th chip select electrode. The plurality of chip select electrodes is sporadically disposed in the first electrodes.

Other objects and further features of the present invention will be apparent from the following detailed description when read in conjunction with the accompanying drawings.

DETAILED DESCRIPTION OF THE PREFERRED EMBODIMENTS

Figure 1:
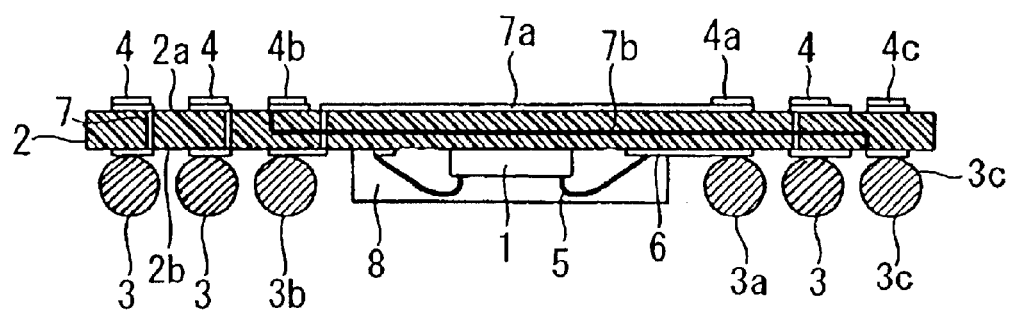
FIG. 1 is a schematic sectional view of a semiconductor device according to First Embodiment of the present invention.

In the following, principles and embodiments of the present invention will be described with reference to the accompanying drawings The members and steps that are common to some of the drawings are given the same reference numerals and redundant descriptions therefore may be omitted.

First Embodiment

Figure 2:
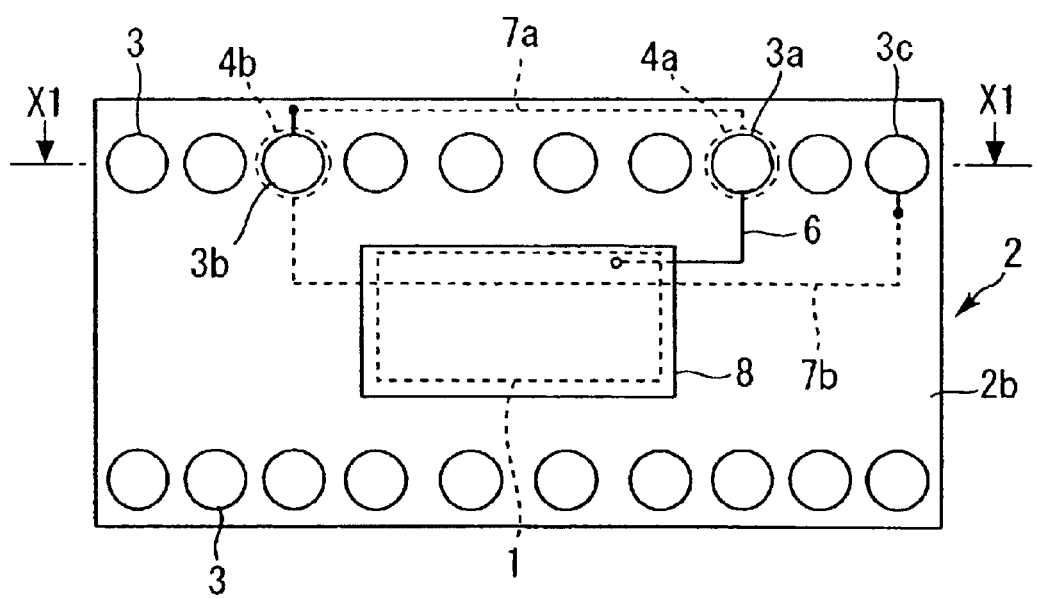
FIG. 2 is a schematic plan of the semiconductor device of FIG. 1.
Figure 3:
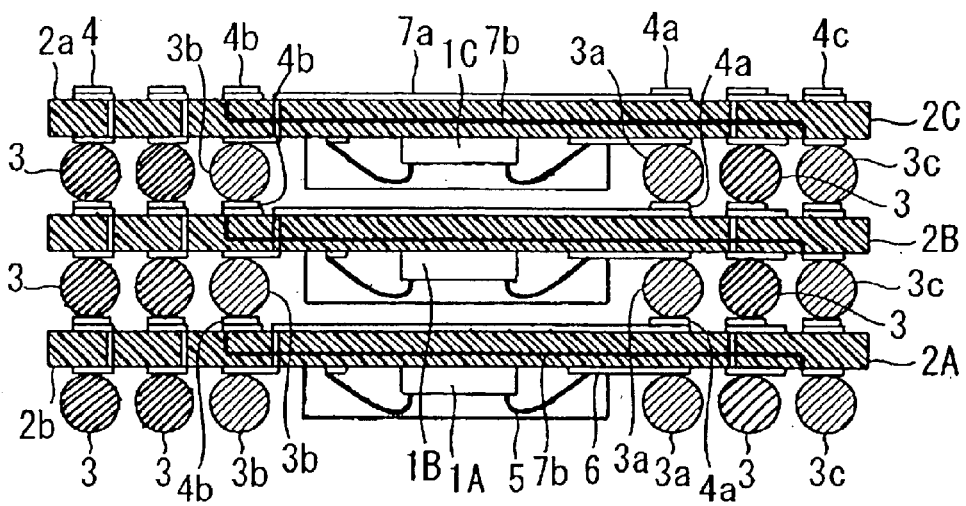
FIG. 3 is a schematic sectional view of a semiconductor device module produced by laminating the semiconductor device of FIG. 1.

First Embodiment of the present invention will be described in detail below referring to the drawings. FIG. 1 is a schematic sectional view of a semiconductor device according to First Embodiment of the present invention, and FIG. 2 is a schematic plan thereof. Specifically, FIG. 1 shows the cross-section along the X1—X1 line in FIG. 2. FIG. 3 is a schematic sectional view of a semiconductor device module produced by laminating the semiconductor device of FIG. 1.

For the ease of understanding about the connection of wirings within an interposer, more than one cross-section in FIG. 2 is superposed in sectional views of FIGS. 1 and 3.

In FIGS. 1 and 3, the reference numeral 1 denotes a chip (semiconductor element); 2 and 2A to 2C denote interposers (substrates); 2*a* denotes the back of the interposer 2; 2*b* denotes the surface of the interposer 2; 3 denotes a common electrode; 3*a* denotes a first chip select electrode (chip select electrode No. 1); 3*b* denotes a second chip select electrode (chip select electrode No. 2); 3*c* denotes a third chip select electrode (chip select electrode No. 3). The reference numeral 4 denotes second electrodes for the common electrodes; 4*a* denotes a second electrode for the first chip select electrode; 4*b* denotes a second electrode for the second chip select electrode; 4*c* denotes a second electrode for the third chip select electrode; 5 denotes thin metal wires; 6 denotes a first wiring for chip selecting; 7 denotes wirings for the common electrode; 7*a* denotes a second wiring for chip selecting; 7*b* denotes a third wiring for chip selecting; and 8 denotes an encapsulating resin.

As FIGS. 1 and 2 show, a chip 1 it disposed on substantially the central portion of the surface 2*b* of an interposer 2. A first electrode group is linearly disposed on the both sides of the chip 1 so as to sandwich the chip 1. The first electrode group comprises a plurality of common electrodes 3 and a plurality of chip select electrodes 3*a* to 3*c*, and these are, for example, solder-ball terminals disposed so as to protrude from the surface 2*b* of an interposer 2.

The plurality of chip select electrodes 3*a* to 3*c* are scatteringly disposed in the first electrode group. That is to say, as FIG. 2 shows, although all of chip select electrodes 3a to 3c are disposed in a row of the first electrode group, four common electrodes 3 are disposed between the first chip select electrode 3a and the second chip select electrode 3b. Also, one common electrode 3 is disposed between the first chip select electrode 3a and the third chip select electrode 3c. Thus, the chip select electrodes 3a to 3c are relatively irregularly disposed on the surface 2b of the interposer 2.

Also, a second electrode group is disposed on the back 2a of the interposer 2 on the location corresponding to the first electrode group on the surface 2b. The second electrode group comprises a plurality of second electrodes 4 for common electrodes and a plurality of second electrodes 4a to 4c for chip select electrodes, and these are land patterns formed by, for example, photoengraving. The second electrodes 4 for common electrodes on the back 2a are disposed on the locations plane-symmetrical to the common electrodes 3 on the surface 2b, and the second electrodes 4a to 4c for chip select electrodes are disposed on the locations plane-symmetrical to the chip select electrodes 3a to 3c on the surface 2b.

Thereby, when the semiconductor devices are laminated, the first electrode group of the upper-level semiconductor device is overlaid on the second electrode group of the lower-level semiconductor device, so that both electrodes are electrically and mechanically connected.

Also, as FIGS. 1 and 2 show, the first chip select electrode 3a is electrically connected to the predetermined electrode pad on the chip 1 through a thin metal wire 5 and a first wiring for chip selecting 6. The second chip select electrode 3b is electrically connected to the second electrode 4a for the first chip select electrode disposed on the back 2a side of the first chip select electrode 3a through a second wiring for chip selecting 7a. Furthermore, the third chip select electrode 3c is electrically connected to the second electrode 4b for the second chip select electrode disposed on the back 2a side of the second chip select electrode 3b through a third wiring for chip selecting 7b.

On the other hand, the common electrodes 3 are connected to the chip 1 through the thin metal wires and wirings (not shown), and also connected to the second electrodes 4 for common electrodes on the back 2a through the wirings 7 for common electrodes.

In FIG. 2, the solid-line portions of wirings show wirings exposed on the surface 2b of the interposer 2, and the broken-line portions of wirings show wirings exposed on the back 2a of the interposer 2, or wirings formed inside the interposer 2.

Also, the wirings 7 for common electrodes and the second wiring 7a for chip selecting are connected to the first electrodes on the surface 2b and the second electrodes on the back 2a through through-holes formed so as to pass through the interposer 2, respectively.

Whereas, the third wiring 7b for chip selecting is formed between the layers of the interposer 2, which is formed as a two-layer structure, and connects between the third chip select electrode 3c on the surface 2b and the second electrode 4b for the second chip select electrode on the back 2a through through-holes formed in both layers of the interposer 2.

Thus, the wirings 7 for common electrodes, the second wiring 7a for chip selecting, and the third wiring 7b for chip selecting are arranged inside and outside the interposer 2 not to contact with each other.

The semiconductor devices thus constituted are laminated, as shown in FIG. 3, to form a semiconductor device module. Specifically, the first electrode group formed on the surface 2b of the interposer 2B in the second-level semiconductor device is stacked on the second electrode group formed on the back 2a of the interposer 2A in the first-level semiconductor device. Furthermore, the first electrode group formed on the surface 2b of the interposer 2C in the third-level semiconductor device is stacked on the second electrode group formed on the back 2a of the interposer 2B in the second-level semiconductor device.

The semiconductor device module thus formed is packaged on a circuit substrate (not shown). Specifically, the first electrode group in the first-level semiconductor device is electrically and mechanically connected to the predetermined electrodes formed on the circuit substrate.

Then, common signals transmitted from the circuit substrate, such as ground signals, address signals, and data signals, are transmitted to chips 1A, 1B, and 1C of the first, second and third levels through the common electrodes 3 and the second electrodes 4 for common electrodes, respectively.

On the other hand, the chip select signals transmitted from the circuit substrate for selecting predetermined chips 1A to 1C are transmitted to only predetermined chips 1A to 1C through predetermined chip select electrodes 3a to 3c.

Specifically, the first chip select signal for selecting the chip 1A of the first-level semiconductor device transmitted from the circuit substrate is transmitted to the chip 1A of the first-level semiconductor device through the first chip select electrode 3a, the first wiring 6 for chip selecting, and a thin metal wire 5 in the first-level interposer 2A.

The second chip select signal for selecting the chip 1B of the second-level semiconductor device transmitted from the circuit substrate is transmitted to the chip 1B of the second-level semiconductor device through the second chip select electrode 3b, the second wiring for chip selecting 7a, and the second electrode 4a for the first chip select electrode in the first-level interposer 2A; and further through the first chip select electrode 3a, the first wiring 6 for chip selecting, and a thin metal wire 5 in the second-level interposer 2B.

The third chip select signal for selecting the chip 1C of the third-level semiconductor device transmitted from the circuit substrate is transmitted to the chip 1C of the third-level semiconductor device through the third chip select electrode 3c, the third wiring 7b for chip selecting, and the third electrode 4c for the second chip select electrode in the first-level interposer 2A; through the second chip select electrode 3b, the second wiring for chip selecting 7a, and the second electrode 4a for the first chip select electrode in the second-level interposer 2B; and further through the first chip select electrode 3a, the first wiring 6 for chip selecting, and a thin metal wire 5 in the third-level interposer 2C.

As described above, according to the semiconductor device constituted as First Embodiment, a semiconductor device module can be formed using a common interposer 2 on which wirings 7, 7a, and 7b of the same shape, and electrodes 3, 3a to 3c, 4, and 4a to 4c of the same shape are disposed. Therefore, the packaging area of the semiconductor device on a circuit substrate can be reduced, and a semiconductor device module of a relatively low price for general purpose can be formed.

Furthermore, since a plurality of chip select electrodes 3a to 3c formed on the surface 2b of the interposer 2 can be scatteringly disposed on optional locations on the surface 2b, the locations of electrodes corresponding to chip select electrodes on a carrying circuit substrate can be determined relatively freely. Therefore, the freedom of circuit design can be raised in the entire circuit made of a circuit substrate and a semiconductor device module.

Although the number of lamination levels of semiconductor devices in a semiconductor device module is three in First Embodiment, the number of lamination levels is not limited thereto.

Here, when the number of lamination levels of semiconductor devices is N (N: integer of 2 or larger), N chip select electrodes are disposed in the semiconductor device. The relationship between these chip select electrodes and the second electrodes for chip select electrodes on the back 2a is as follows: The first chip select electrode (the first chip select electrode 3a) is electrically connected only to the chip 1. The N-th chip select electrode (chip select electrode No. N) is electrically connected only to the second electrodes for chip select electrode No. N−1 on the back 2a corresponding to (N−1)th chip select electrode.

Although the surface of the chip 1 side in the first-level semiconductor device is made to face the circuit substrate in First Embodiment, the direction of the semiconductor device module to the circuit substrate is not limited thereto.

Also, in First Embodiment, although solder balls are used as the first electrodes, and land patterns are used as the second electrodes, the constitution of the first and second electrodes is not limited thereto. For example, the constitution wherein land patterns are used as the first electrodes, and solder-ball terminals are used as the second electrodes may also be possible. Columnar connecting terminals may also be used in place of solder-ball terminals.

Also, the chip select signals in First Embodiment mean all the signals transmitted between the circuit substrate and predetermined chips 1A to 1C through predetermined chip select electrodes 3a to 3c, and various signals can be used corresponding to the purposes thereof.

Second Embodiment

Figure 4:
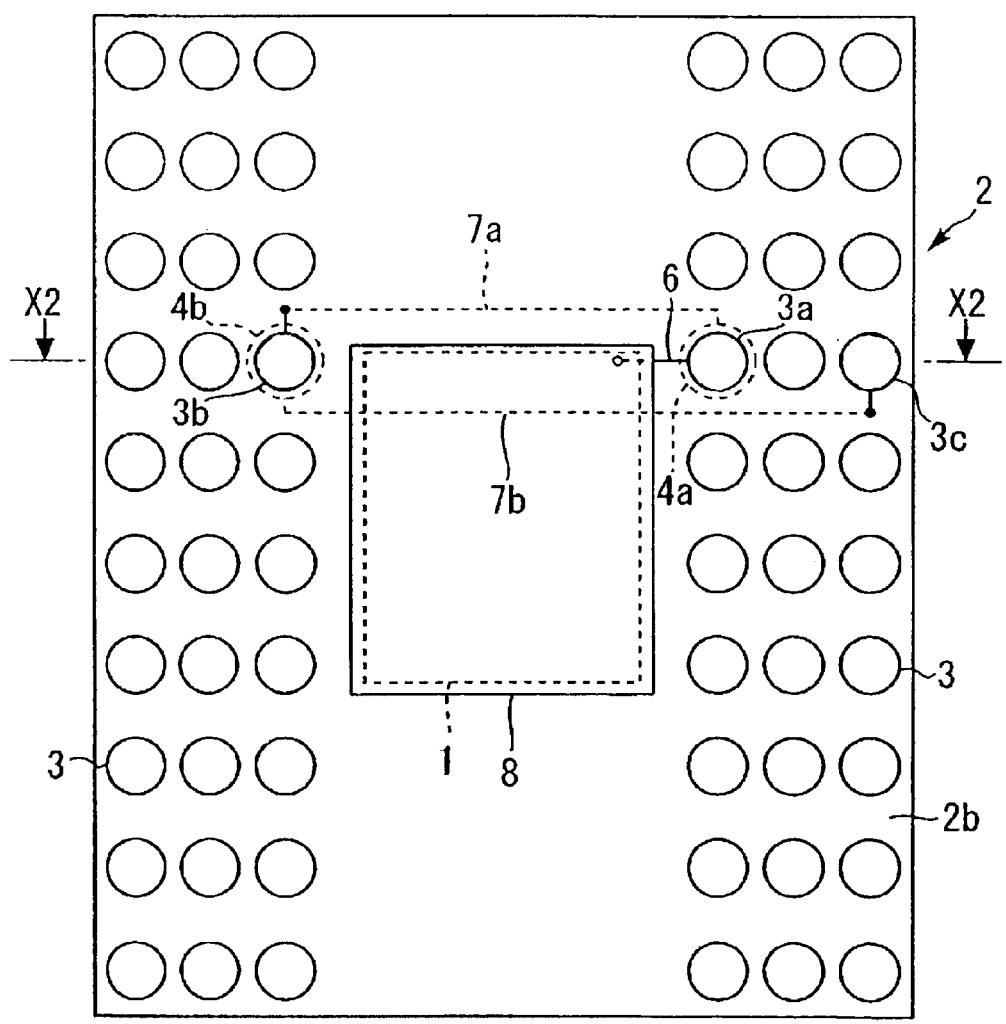
FIG. 4 is a schematic plan of a semiconductor device according to Second Embodiment of the present invention.

Second Embodiment of the present invention will be described in detail below referring to the drawings. FIG. 4 is a schematic plan of a semiconductor device according to Second Embodiment of the present invention. Specifically, FIG. 4 corresponds to FIG. 2 of First Embodiment, and the schematic cross-section along the X2—X2 line in FIG. 4 corresponds to the schematic cross-section in FIG. 1. Furthermore, the schematic cross-section of the semiconductor device module produced by laminating the semiconductor devices shown in FIG. 4 corresponds to the schematic cross-section in FIG. 3.

Second Embodiment differs from First Embodiment chiefly in the disposition of the first electrode group on the surface 2b of the interposer 2.

In FIG. 4, the reference numeral 1 denotes a chip; 2 denotes an interposer; 2b denotes the surface of the interposer 2; 3 denotes a common electrode; 3a denotes a first chip select electrode; 3b denotes a second chip select electrode; 3c denotes a third chip select electrode; 4a denotes a second electrode for the first chip select electrode formed on the back; 4b denotes a second electrode for the second chip select electrode formed on the back; 6 denotes a first wiring for chip selecting; 7a denotes a second wiring for chip selecting formed on the back of the interposer 2; 7b denotes a third wiring for chip selecting formed inside the interposer 2; and 8 denotes an encapsulating resin encapsulating the chip 1.

As FIG. 4 shows, an encapsulated member 8 wherein a chip 1 is encapsulated is disposed on the substantially central portion of the surface 2b of an interposer 2 as in First Embodiment. Three rows of a first electrode group are disposed on the both sides of the encapsulated member 8 so as to sandwich the encapsulated member 8. The first electrode group comprises a plurality of common electrodes 3 and a plurality of chip select electrodes 3a to 3c as in First Embodiment.

The plurality of chip select electrodes 3a to 3c are scatteringly disposed in the first electrode group. Specifically, when the location of the first electrode disposed on the upper left end of the first electrode group in FIG. 4 is named as the row 1-column 1 location, the first chip select electrode 3a is disposed on the row 4-column 4 location, the second chip select electrode 3b is disposed on the row 4-column 3 location, and the third chip select electrode 3c is disposed on the row 4-column 6 location. On the locations other than the locations whereon chip select electrodes 3a to 3c are disposed, common electrodes 3 are disposed. Thus, the plurality of chip select electrodes 3a to 3c are relatively irregularly disposed on the surface 2b of the interposer 2.

Also, a second electrode group comprises a plurality of second electrodes for common electrodes and a plurality of second electrode for chip select electrodes 4a to 4c. The second electrode group is disposed on the back 2a of the interposer 2 on the location corresponding to the first electrode group on the surface 2b as in First Embodiment. Wirings 7 for common electrodes, the second wiring 7a for chip selecting, and the third wiring 7b for chip selecting are laid inside and outside the interposer 2 so as not to contact with each other.

The semiconductor devices thus constituted are laminated as in First Embodiment to form a semiconductor device module, and the semiconductor device module is mounted on a circuit substrate. Chip select signals are transmitted between the circuit substrate and predetermined chip 1A to 1C through predetermined chip select electrodes 3a to 3c. Furthermore, common signals, such as address signals are transmitted between the circuit substrate and all the chips 1A to 1C through common electrodes.

As described above, in the semiconductor device constituted as in Second Embodiment, since a semiconductor module can be formed by using the interposer 2 in common as in First Embodiment, the packaging area of the semiconductor device in the circuit substrate can be reduced, and a semiconductor device module of a relatively low price for general use can be formed.

Furthermore, since a plurality of chip select electrodes 3a to 3c formed on the surface 2b of the interposer 2 can be scatteringly disposed on optional locations on the surface 2b, the locations of electrodes corresponding to chip select electrodes on the circuit substrate can be determined relatively freely, and the freedom of circuit design can be raised.

Third Embodiment

Figure 5:
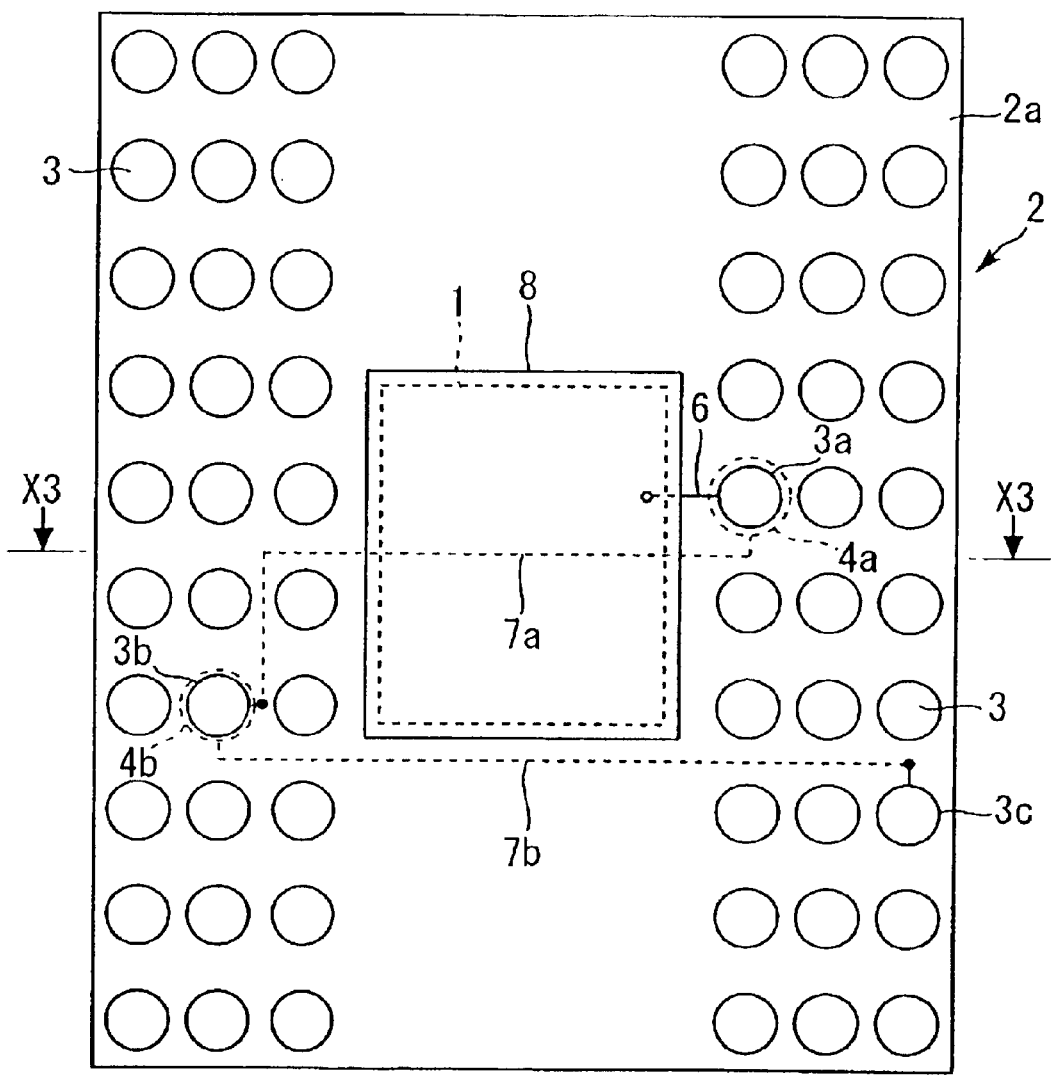
FIG. 5 is a schematic plan of a semiconductor device according to Third Embodiment of the present invention.
Figure 6:
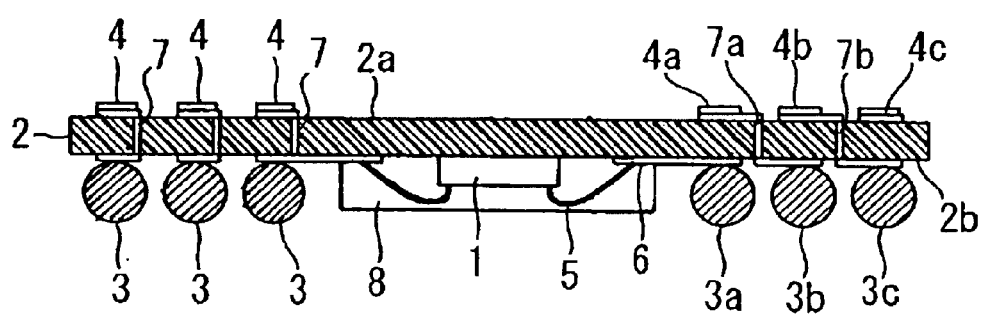
FIG. 6 is a schematic sectional view of a conventional semiconductor device.
Figure 7:
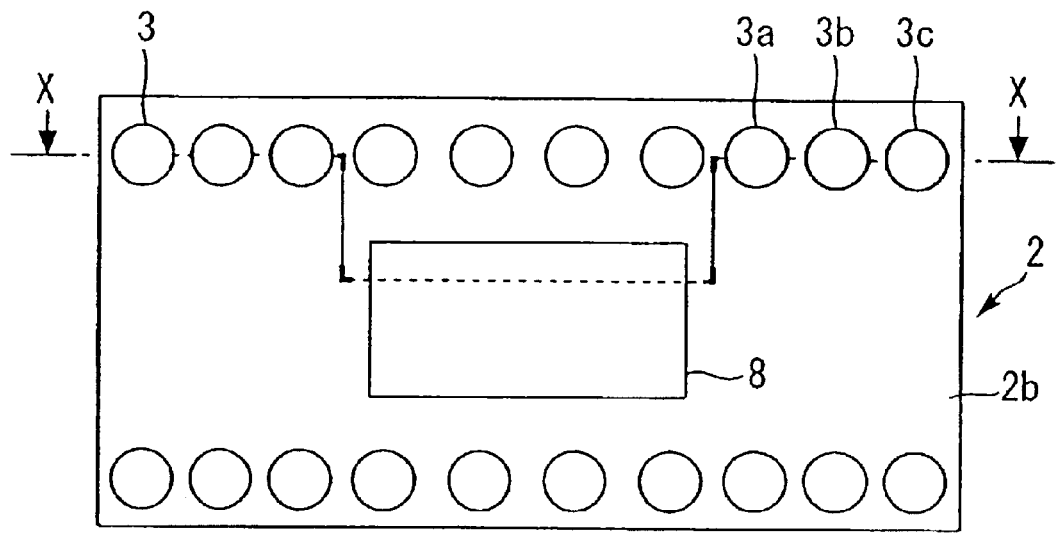
FIG. 7 is a schematic plan of the conventional semiconductor device of FIG. 6.
Figure 8:
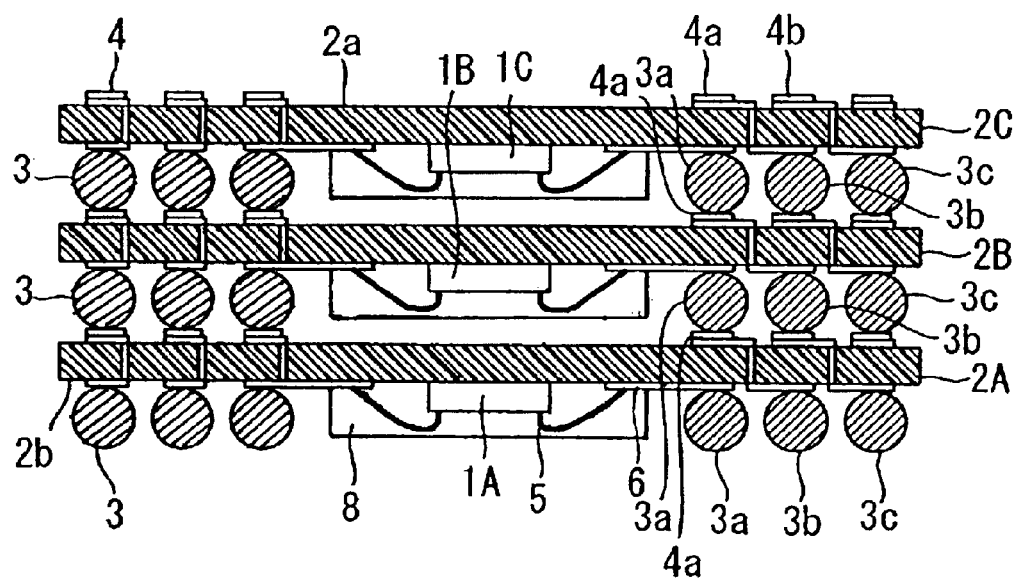
FIG. 8 is a schematic sectional view of a semiconductor device module manufactured by laminating the semiconductor devices of FIG. 6.

Third Embodiment of the present invention will be described in detail below referring to the drawings. FIG. 5 is a schematic plan of a semiconductor device according to Third Embodiment of the present invention. Specifically, FIG. 5 corresponds to FIG. 2 of First Embodiment, and the schematic cross-section along the X3—X3 line in FIG. 5 corresponds to the schematic cross-section in FIG. 1. Furthermore, the schematic cross-section of the semiconductor device module produced by laminating the semiconductor devices shown in FIG. 5 corresponds to the schematic cross-section in FIG. 3.

Third Embodiment differs from Second Embodiment in the disposition of a plurality of chip select electrodes 3a to 3c on the surface 2b of the interposer 2.

Here, as FIG. 5 shows, an encapsulated member 8 wherein a chip 1 is encapsulated is disposed on the substantially central portion of the surface 2b of an interposer 2 as in First Embodiment, and three rows of a first electrode group are disposed on the both sides of the encapsulated member 8 so as to sandwich the encapsulated member 8.

The plurality of chip select electrodes 3a to 3c are scatteringly disposed in the first electrode group.

Specifically, when the location of the first electrode disposed on the upper left end of the first electrode group in FIG. 5 is named as the row 1-column 1 location, the first chip select electrode 3a is disposed on the row 5-column 4 location, the second chip select electrode 3b is disposed on the row 7-column 2 location, and the third chip select electrode 3c is disposed on the row 8-column 6 location. On the locations other than the locations whereon chip select electrodes 3a to 3c are disposed, common electrodes 3 are disposed. Thus, the plurality of chip select electrodes 3a to 3c are relatively irregularly disposed on the surface 2b of the interposer 2.

As described above, in the semiconductor device constituted as in Third Embodiment, since a semiconductor module can be formed by using an interposer 2 in common as in Second Embodiment, the packaging area of the semiconductor device in the circuit substrate can be reduced, and a semiconductor device module of a relatively low price for general use can be formed.

Furthermore, since a plurality of chip select electrodes 3a to 3c can be scatteringly disposed on optional locations on the surface 2b, the locations of electrodes corresponding to chip select electrodes on the circuit substrate can be determined relatively freely, and the freedom of circuit design can be raised.

The disposition of the first and second electrode groups on the interposer 2 is not limited to the above-described embodiments, but various forms can be used.

Further, the present invention is not limited to these embodiments, but variations and modifications may be made without departing from the scope of the present invention.

The entire disclosure of Japanese Patent Application No. 2001-286635 filed on Sep. 20, 2001 containing specification, claims, drawings and summary are incorporated herein by reference in its entirety.

What is claimed is:

1. A semiconductor device comprising:

a substrate having a front surface and a back surface;

a semiconductor element disposed on the front surface of said substrate;

one or more first electrodes disposed on the front surface of said substrate, wherein said first electrodes include a plurality of chip select electrodes operative, when activated, to select the semiconductor element or another semiconductor element and wherein said plurality of chip select electrodes are irregularly disposed in said first electrodes, and one or more second electrodes disposed on the back surface of said substrate at respective positions, each opposing respective said first electrodes, wherein only a first chip select electrode among said plurality of chip select electrodes is electrically connected to said semiconductor element, and wherein an N-th chip select electrode among said plurality of chip select electrodes is electrically connected only to a respective second electrode disposed on the back surface at a position opposing the (N−1)-th chip select electrode, wherein N is an integer greater than one.

2. The semiconductor device according to claim 1, wherein said first electrodes include solder-ball terminals protruding from the front surface of said substrate, and said second electrodes are land patterns disposed on the back surface of said substrate at positions plane-symmetrical to said first electrodes.

3. The semiconductor device according to claim 1, wherein said first electrodes further include a common electrode electrically connected to said semiconductor element and one or more of said second electrodes.

4. A semiconductor device comprising:

a substrate having a front surface and a back surface;

a semiconductor element disposed on the front surface of said substrate;

one or more first electrodes disposed on the front surface of said substrate, wherein said first electrodes include a plurality of chip select electrodes operative, when activated, to select the semiconductor element or another semiconductor element, and wherein said plurality of chip select electrodes are irregularly disposed in said first electrodes, one or more second electrodes disposed on the back of said substrate at respective positions opposing respective said first electrodes, wherein only a first chip select electrode among said plurality of chip select electrodes is electrically connected to said semiconductor element, and wherein a second chip select electrode among said plurality of chip select electrodes is electrically connected to a respective electrode disposed on the back surface at a position opposing the first chip select electrode.

5. The semiconductor device of claim 4, wherein the second chip select electrode is electrically connected only to the respective electrode disposed on the back surface at the position corresponding to the first chip select electrode.

6. The semiconductor device of claim 4, wherein the second chip select electrode is not electrically connected to the semiconductor element.

7. The semiconductor device of claim 5, wherein a third chip select electrode of said plurality of chip select electrodes is electrically connected only to a respective second electrode disposed on the back surface at a position corresponding to the second chip select electrode.

* * * * *